(12) United States Patent
Maeda et al.

(10) Patent No.: US 7,569,335 B2
(45) Date of Patent: Aug. 4, 2009

(54) PHOTOSENSITIVE RESIN COMPOSITION FOR OPTICAL WAVEGUIDES, AND OPTICAL WAVEGUIDE AND MANUFACTURING METHOD THEREOF

(75) Inventors: Yukio Maeda, Chuo-ku (JP); Yuuichi Eriyama, Chuo-ku (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 12/033,334

(22) Filed: Feb. 19, 2008

(65) Prior Publication Data

US 2008/0145016 A1 Jun. 19, 2008

Related U.S. Application Data

(62) Division of application No. 11/255,030, filed on Oct. 21, 2005.

(30) Foreign Application Priority Data

Oct. 21, 2004 (JP) ............... 2004-307036
Sep. 6, 2005 (JP) ............... 2005-258601

(51) Int. Cl.
G03F 7/40 (2006.01)
G03F 7/32 (2006.01)
G02B 6/10 (2006.01)
G03F 7/028 (2006.01)

(52) U.S. Cl. .................. 430/321; 385/143; 385/131; 430/284.1; 522/96

(58) Field of Classification Search ............... None
See application file for complete search history.

(56) References Cited

U.S. PATENT DOCUMENTS 6,023,547 A * 2/2000 Tortorello ................ 385/114

(Continued)

FOREIGN PATENT DOCUMENTS

JP 06-230212 8/1994

(Continued)

OTHER PUBLICATIONS

PTO 08-2472, English translation of Ohara et al, JP 2002-229208 A, United States Patent and Trademark Office,, Washington, D.C., Feb. 2008, tagged as Document No. 02-229208, but actually 2002-229208 as evidenced by Matching application No. with JP 2002-31063A, Date of Translation: Feb. 2008, Translated by FLS. Inc. 24 pages.*

(Continued)

*Primary Examiner*—Cynthia Hamilton
(74) *Attorney, Agent, or Firm*—Oblon, Spivak, McClelland, Maier & Neustadt, P.C.

(57) ABSTRACT

There is provided a photosensitive resin composition for forming an optical waveguide which has high shape precision and excellent transmission characteristics under high temperature and high humidity. A composition of the present invention contains (A) a polymer having structures represented by the following general formulae (I) and (2)

-continued

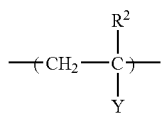

(2)

(in the formulae, each of $R^1$ and $R^2$ is independently a hydrogen atom or an alkyl group having 1 to 12 carbon atoms; $R^3$ is an organic group containing a radical-polymerizable reactive group; X is a single bond or a bivalent organic group; and Y is a non-polymerizable organic group), (B) a compound having at least one ethylenic unsaturated group in the molecule thereof, having a molecular weight below 1,000 and having a boiling point of at least 130° C. at 0.1 MPa, and (C) a photo-radical polymerization initiator.

6 Claims, 2 Drawing Sheets

U.S. PATENT DOCUMENTS

2003/0026569 A1* 2/2003 Eldada et al. ............... 385/129

FOREIGN PATENT DOCUMENTS

| JP | 2000-180643 | | 6/2000 |
| JP | 2002-229208 A | * | 8/2002 |
| JP | 2003-149475 A | * | 5/2003 |
| JP | 2003-195079 | | 7/2003 |

OTHER PUBLICATIONS

English translation of JP, 2003-149475, A (2003) from machine translation from AIPN Japan Patent Office Natinal center for Industrial Property Information and Training, generated Jun. 19, 2008, 6 pages.*

Sugai et al (AN 1995:441140) from ACS on STN file CAPLUS entered Mar. 25, 1995 one page.

Sugai et al (Publication No. 06-230212 Patent Abstracts of Japan and attached English machine translation of JP 06-230212 A from PAJ www19.ipdl.ncipi.go.jp, genereated on Nov. 27, 2006.

* cited by examiner

F I G. 1
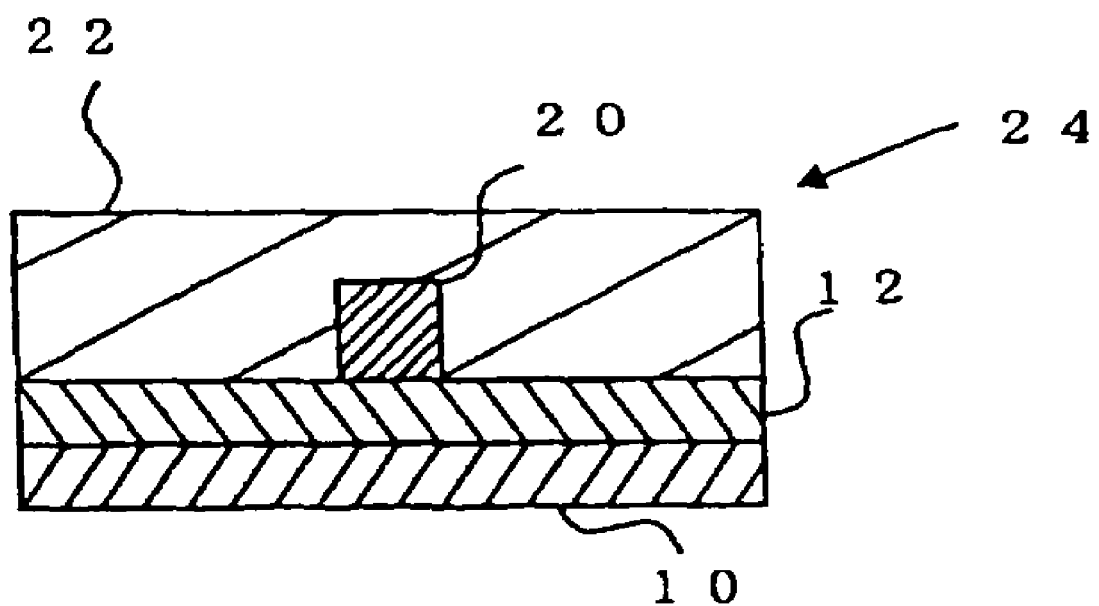

PHOTOSENSITIVE RESIN COMPOSITION FOR OPTICAL WAVEGUIDES, AND OPTICAL WAVEGUIDE AND MANUFACTURING METHOD THEREOF

CROSS REFERENCE TO RELATED APPLICATIONS

This application is a division of U.S. patent application Ser. No. 11/255,030, filed Oct. 21, 2005, the disclosure of which is incorporated herein by reference in its entirety. This application claims priority to Japanese Patent Application No. 2004-307036, filed Oct. 21, 2004, and Japanese Patent Application No. 2005-258601, filed Sep. 6, 2005, the disclosures of which are incorporated herein by reference in their entireties.

BACKGROUND OF THE INVENTION

1. Field of the Invention

The present invention relates to a photosensitive resin composition for optical waveguides, and in particular to a photosensitive resin composition for forming optical waveguides having high shape precision, and excellent transmission characteristics under high temperature and high humidity.

2. Description of the Related Art

As we enter the multimedia age, due to demands to increase the capacity and speed of data processing in optical communication systems and computers, optical waveguides have come to receive attention as light transmission media. A silica optical waveguide, which is a typical example of conventional optical waveguides, is generally manufactured through the following steps (1) to (3).

(1) A lower clad layer comprising a glass film is formed on a silicon substrate using a method such as flame hydrolysis deposition (FHD) or CVD.

(2) A thin film of an inorganic substance having a higher refractive index than the refractive index of the lower clad layer is formed on the lower clad layer, and this thin film is patterned using reactive ion etching (RIE), thus forming a core portion.

(3) Furthermore, an upper clad layer is formed using a method of flame hydrolysis deposition.

However, with such a method of manufacturing a silica optical waveguide, there have been problems such as a special manufacturing apparatus being required, and the manufacture taking a long time.

To solve these problems, there has been proposed a method of manufacturing an optical waveguide in which the core portion or the like is formed by irradiating prescribed parts of a silicone composition containing a photopolymerizable component with a prescribed amount of light so as to cure these parts, and then developing the unexposed parts (see Japanese Patent Application Laid-open No. 2000-180643). Compared with the conventional silica optical waveguide manufacturing method, this method is advantageous in that an optical waveguide can be manufactured in a shorter time and at lower cost. However, this method has constraints such as it being necessary to use a special silicone oligomer.

On the other hand, there has been proposed a radiation-curable composition for forming optical waveguides containing (A) a vinyl polymer having carboxyl groups, polymerizable groups and other organic groups, (B) a compound having at least two polymerizable reactive groups in the molecule thereof, and (C) a radiation polymerization initiator (see Japanese Patent Application Laid-open No. 2003-195079). By means of this composition, an optical waveguide having high shape precision and excellent transmission characteristics can be manufactured.

SUMMARY OF THE INVENTION

According to the findings of the present inventors, an optical waveguide formed using a radiation-curable composition for forming optical waveguides containing above components (A) to (C) has high shape precision, and has excellent transmission characteristics under an ordinary atmosphere (i.e. room temperature and low humidity), but due to component (A) having carboxyl groups, the hygroscopicity is high, and hence there is a problem of the transmission characteristics under high temperature and high humidity deteriorating.

It is thus an object of the present invention to provide a photosensitive resin composition enabling formation of excellent optical waveguides having high shape precision and reduced deterioration of transmission characteristics under high temperature and high humidity.

The present inventors carried out assiduous studies to attain the above object, and as a result accomplished the present invention upon discovering that an optical waveguide having high shape precision and excellent transmission characteristics under high temperature and high humidity can be formed if a copolymer containing constituent units having a side chain part containing a radical-polymerizable reactive group bonded on via a urethane linkage, and constituent units having non-polymerizable side chains is used instead of component (A) which is the conventional radiation-curable composition for forming optical waveguides described above.

That is, the present invention provides the following [1] to [6].

[1] A photosensitive resin composition for optical waveguides, containing:

(A) a polymer containing structures represented by the following general formulae (1) and (2)

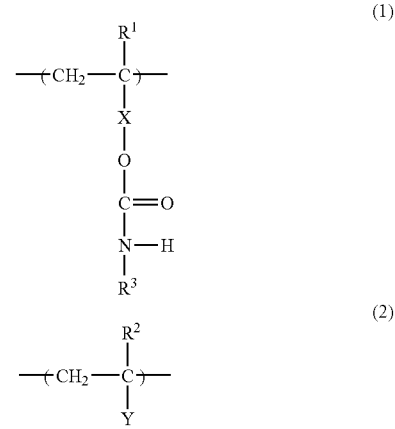

(in the formulae, each of $R^1$ and $R^2$ is independently a hydrogen atom or an alkyl group having 1 to 12 carbon atoms; $R^3$ is an organic group containing a radical-polymerizable reactive group; X is a single bond or a bivalent organic group; and Y is a non-polymerizable organic group), (B) a compound having at least one ethylenic unsaturated group in the molecule thereof, having a molecular weight below 1,000 and having a boiling point of at least 130° C. at 0.1 MPa, and (C) a photo-radical polymerization initiator.

[2] The photosensitive resin composition according to [1] above, wherein component (A) is a polymer containing structures represented by the following general formulae (3) and (4)

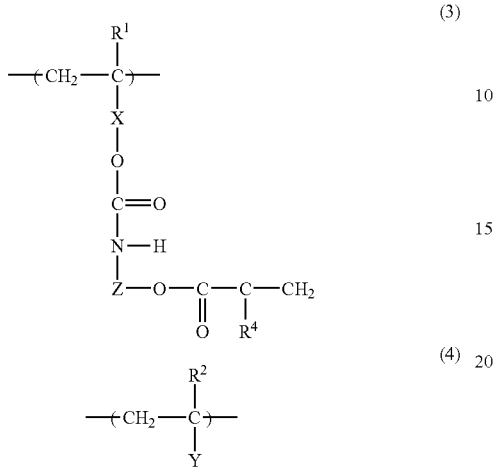

(in the formulae, each of $R^1$ and $R^2$ is independently a hydrogen atom or an alkyl group having 1 to 12 carbon atoms; $R^4$ is a hydrogen atom or a methyl group; each of X and Z independently is a single bond or a bivalent organic group; and Y is a non-polymerizable organic group).

[3] The photosensitive resin composition according to [1] or [2] above, further containing (D) an organic solvent.

[4] An optical waveguide comprising a lower clad layer, a core portion, and an upper clad layer, wherein at least one of the lower clad layer, the core portion, and the upper clad layer comprises a cured material of a photosensitive resin composition according to any of [1] through [3] above.

[5] The optical waveguide according to [4] above, wherein each of the lower clad layer, the core portion, and the upper clad layer comprises a cured material of a photosensitive resin composition according to any of [1] through [3] above, and the core portion has a refractive index at least 0.1% greater than the refractive index of each of the lower clad layer and the upper clad layer.

[6] A method of manufacturing an optical waveguide comprising a lower clad layer, a core portion, and an upper clad layer, and wherein the method comprises a step of forming the lower clad layer, a step of forming the core portion, and a step of forming the upper clad layer, wherein at least one of these steps is a photocuring step of curing a photosensitive resin composition according to any of [1] through [3] above by irradiating the composition with light.

By means of photosensitive resin compositions for optical waveguides of the present invention, optical waveguides having high shape precision and excellent transmission characteristics under high temperature and high humidity can be formed.

BRIEF DESCRIPTION OF THE DRAWINGS

FIG. 1 is a sectional view showing schematically an example of an optical waveguide of the present invention.

DESCRIPTION OF THE PREFERRED EMBODIMENTS

Figure 2:
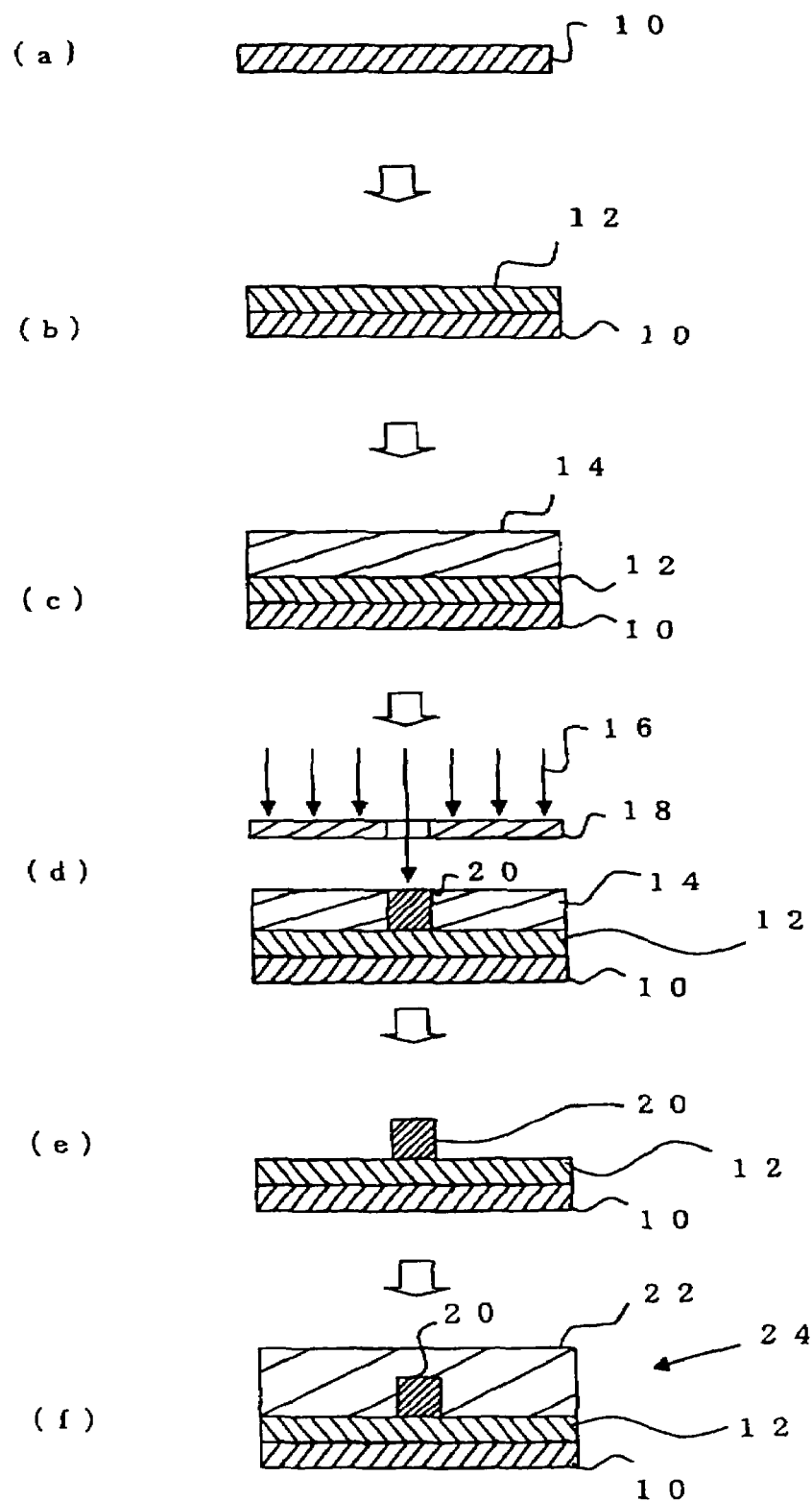
FIG. 2 is a flowchart showing an example of an optical waveguide manufacturing method of the present invention.

Following is a detailed description of components (A) to (D) and other optional components constituting a photosensitive resin composition for optical waveguides of the present invention.

[Component (A)]

Component (A) used in the present invention is a copolymer (e.g. a random copolymer) containing structures represented by the following general formulae (1) and (2).

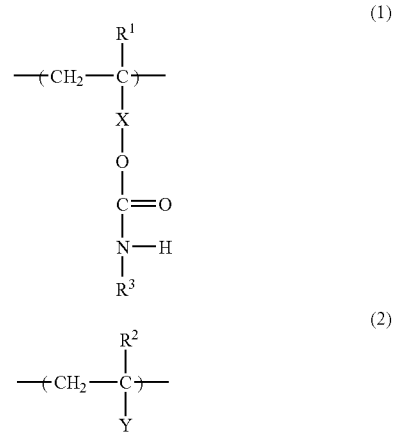

(In the formulae, each of $R^1$ and $R^2$ is independently a hydrogen atom or an alkyl group having 1 to 12 carbon atoms; $R^3$ is an organic group having a radical-polymerizable reactive group; X is a single bond or a bivalent organic group; and Y is a non-polymerizable organic group.)

Each of $R^1$ and $R^2$ in general formulae (1) and (2) is preferably a hydrogen atom or an alkyl group having 1 to 5 carbon atoms, more preferably a hydrogen atom or a methyl group.

Examples of the radical-polymerizable reactive group in $R^3$ in general formula (I) include a (meth)acryloyl group, a vinyl group, and an allyl group.

Examples of X include an organic group having a structure represented by the following general formula (5), and a phenylene group.

(In the formula, $R^5$ is an alkylene group having 1 to 8 carbon atoms.)

Examples of Y include a organic group having a structure represented by the following general formula (6), a phenyl group, a cyclic amide group, and a pyridyl group.

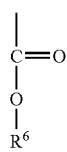

(In the formula, $R^6$ is a group having a linear, branched, or cyclic carbon chain having 1 to 20 carbon atoms.)

Preferable examples of copolymers containing structures represented by above general formulae (1) and (2) are copolymers containing structures represented by the following general formulae (3) and (4).

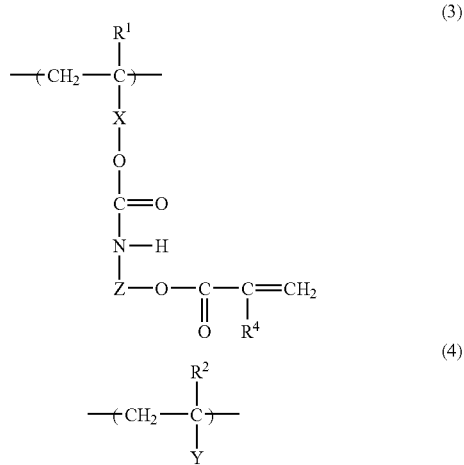

(In the formulae, each of $R^1$ and $R^2$ is independently a hydrogen atom or an alkyl group having 1 to 12 carbon atoms; $R^4$ is a hydrogen atom or a methyl group; each of X and Z independently is a single bond or a bivalent organic group; and Y is a non-polymerizable organic group).

Examples of Z (i.e. bivalent organic group) in general formula (3) include an alkylene (e.g. polymethylene) having 1 to 8 carbon atoms.

The weight average molecular weight of component (A) in terms of polystyrene is preferably in a range of 5,000 to 100,000, more preferably 8,000 to 70,000, most preferably 10,000 to 50,000. If this value is less than 5,000, then there will be drawbacks such as the viscosity of the composition being low and hence it becoming impossible to obtain a desired film thickness, whereas if this value exceeds 100,000, then there will be drawbacks such as the viscosity of the composition being high and hence the coatability becoming poor.

An example of a method of manufacturing the component (A) is a method in which (a) at least one radical-polymerizable compound having a hydroxyl group, and (b) at least one radical-polymerizable compound other than components (a) and (c) are subjected to radical copolymerization in a solvent to obtain a copolymer, and then (c) an isocyanate having a radical-polymerizable reactive group (e.g. a (meth)acryloyl group) is added to the hydroxyl groups on side chains of the copolymer obtained.

A description will now be given of the compounds (a) to (c) used in this method.

Compound (a) (i.e. a radical-polymerizable compound having a hydroxyl group) is used so that the hydroxyl group in the compound can be reacted with the isocyanate group (—N═C═O) in compound (c) so as to introduce constituent units having a side chain part containing a radical-polymerizable reactive group originating from compound (c) and a urethane linkage (—NH—CO—) into the copolymer (i.e. component A).

Examples of compound (a) include 2-hydroxyethyl (meth)acrylate, 2-hydroxypropyl (meth)acrylate, 4-hydroxybutyl (meth)acrylate, hydroxymethyl (meth)acrylate, 4-hydroxycyclohexyl (meth)acrylate and the like.

Such compound (a) may be used alone, or two or more may be used in combination.

The content of the compound (a) in component (A) is preferably 3 to 80 mass %, more preferably 7 to 60 mass %, most preferably 10 to 40 mass %.

If this content is less than 3 mass %, then curing will be prone to being insufficient. If this content exceeds 80 mass %, then adjusting the refractive index will tend to become difficult.

Compound (b) (i.e. a radical-polymerizable compound other than compounds (a) and (c)) is used primarily to control the refractive index and the mechanical properties of component (A) suitably.

Examples of compound (b) include (meth)acrylic acid alkyl esters such as methyl (meth)acrylate, ethyl (meth)acrylate, isopropyl (meth)acrylate, n-butyl (meth)acrylate, sec-butyl (meth)acrylate, and t-butyl (meth)acrylate, 2,2,2-trifluoroethyl (meth)acrylate, 2,2,3,3-tetrafluoropropyl (meth)acrylate, 1,1,1,3,3,3-hexafluoroisopropyl (meth)acrylate, 2,2,3,3,3-pentafluoropropyl (meth)acrylate, 2,2,3,3,4,4,4-heptafluorobutyl (meth)acrylate, 2,2,3,4,4,4-hexafluorobutyl (meth)acrylate, 1H,1H,5H-octafluoropentyl (meth)acrylate, 2-(perfluorohexyl)ethyl (meth)acrylate, 2-(perfluorooctyl)ethyl (meth)acrylate, 2-(perfluorodecyl)ethyl (meth)acrylate, 2-(perfluorododecyl)ethyl (meth)acrylate; esters obtained by reacting (meth) acrylic acid with a cyclic hydrocarbon compound such as dicyclopentanyl (meth)acrylate and cyclohexyl (meth)acrylate; (meth)acrylic acid aryl esters such as phenyl (meth)acrylate, benzyl (meth)acrylate, an alcohol (meth)acrylate that is an addition product between phenol and ethylene oxide, an alcohol (meth)acrylate that is an addition product between p-cumylphenol and ethylene oxide, an alcohol (meth)acrylate that is an addition product between nonylphenol and ethylene oxide, o-phenylphenolglycidylether (meth)acrylate, tribromophenyl (meth)acrylate, an alcohol (meth)acrylate that is an addition product between tribromophenol and ethylene oxide, pentabromobenzyl (meth)acrylate, pentabromophenyl (meth)acrylate; aromatic vinyl compounds such as styrene, α-methylstyrene, m-methylstyrene, p-methylstyrene, vinyltoluene, and p-methoxystyrene; conjugated diolefins such as 1,3-butadiene, isoprene, and 1,4-dimethylbutadiene; nitrile group-containing polymerizable compounds such as acrylonitrile and methacrylonitrile; amide linkage-containing polymerizable compounds such as acrylamide and methacrylamide; fatty acid vinyl compounds such as vinyl acetate; and the like.

Of these, dicyclopentanyl (meth)acrylate, methyl (meth)acrylate, n-butyl (meth)acrylate, styrene, α-methylstyrene and so on can be preferably used.

Such compound (b) may be used alone, or two or more may be used in combination.

The content of compound (b) in component (A) is preferably 15 to 92 mass %, more preferably 25 to 84 mass %, most preferably 35 to 78 mass %.

If this content is less than 15 mass %, then adjusting the refractive index will tend to become difficult. If this content exceeds 92 mass %, then curing will be prone to being insufficient.

Examples of compound (c) (i.e. an isocyanate having a radical-polymerizable reactive group such as a (meth)acryloyl group) include 2-methacryloyloxyethyl isocyanate, N-methacryloyl isocyanate, methacryloyloxymethyl isocyanate, 2-acryloyloxyethyl isocyanate, N-acryloyl isocyanate, acryloyloxymethyl isocyanate, 1,1-bis(acryloyloxymethyl) ethyl isocyanate, 1,1-bis(methacryloyloxymethyl)ethyl isocyanate, and the like.

The content of compound (c) in component (A) is preferably 5 to 80 mass %, more preferably 9 to 60 mass %, most preferably 12 to 45 mass %.

If this content is less than 5 mass %, then curing will be prone to being insufficient. If this content exceeds 80 mass %, then adjusting the refractive index will tend to become difficult.

The component (A) may contain constituent units not shown in general formulae (1) and (2). Examples of compounds for introducing such constituent units include dicarboxylic acid diesters such as diethyl maleate, diethyl fumarate, and diethyl itaconate; and chlorine-containing polymerizable compounds such as vinyl chloride and vinylidene chloride. The content of such compounds in component (A) is preferably 0 to 20 mass %, more preferably 0 to 10 mass %.

The types of the compounds for constituting component (A) (i.e. the compounds (a) to (c) and other compounds used as required) are preferably selected such that a copolymer (i.e. component (A)) substantially not having hygroscopic functional groups such as carboxyl groups is obtained. Here, 'hygroscopic functional groups' include carboxyl groups and sulfonic acid groups.

When carrying out the addition reaction using compound (c) any of various additives such as a thermal polymerization inhibitor, a preservative/stabilizer, and a curing catalyst may be added.

A thermal polymerization inhibitor is added to suppress polymerization due to heat. Examples of thermal polymerization inhibitors include pyrogallol, benzoquinone, hydroquinone, Methylene Blue, tert-butylcatechol, monobenzyl ether, methoxyphenol, amylquinone, amyloxyhydroquinone, n-butylphenol, phenol, hydroquinone monopropyl ether, and the like.

Examples of preservatives/stabilizers include 2,6-di-t-butyl-p-cresol, benzoquinone, p-toluquinone, p-xyloquinone, phenyl-α-naphthylamine, and the like.

Examples of curing catalysts include dibutyl tin dilaurate, dibutyl tin dioleate, dibutyl tin diacetate, tetramethoxy titanium, tetraethoxy titanium, and the like.

The total amount of these additives added is normally not more than 10 parts by mass, preferably not more than 5 parts by mass, relative to 100 parts by mass in total of compounds (a) to (c).

Examples of the solvent for the radical polymerization used in the manufacture of component (A) are alcohols such as methanol, ethanol, ethyleneglycol, diethyleneglycol, and propyleneglycol; cyclic ethers such as tetrahydrofuran and dioxane; polyhydric alcohol alkyl ethers such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; polyhydric alcohol alkyl ether acetates such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; and esters such as ethyl acetate, butyl acetate, ethyl lactate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate.

Of these, cyclic ethers, polyhydric alcohol alkyl ethers, polyhydric alcohol alkyl ether acetates, ketones, esters and so on are preferable.

As a catalyst for the radical polymerization used in the manufacture of component (A), any ordinary radical polymerization initiator can be used. Examples include azo compounds such as 2,2'-azobisisobutyronitrile, 2,2'-azobis(2,4-dimethylvaleronitrile), and 2,2'-azobis(4-methoxy-2,4-dimethylvaleronitrile); and organic peroxides such as benzoyl peroxide, lauroyl peroxide, t-butylperoxypivalate, and 1,1'-bis(t-butylperoxy)cyclohexane, and also hydrogen peroxide. In the case of using a peroxide as a radical polymerization initiator, this may be combined with a reducing agent so as to form a redox-type initiator.

As a solvent used in the addition reaction of compound (c) the same solvent as that for the radical polymerization described above can be used on condition that the solvent does not contain a hydroxyl group.

[Component (B)]

Component (B) is a compound having at least one ethylenic unsaturated group in the molecule thereof, having a molecular weight below 1,000 and having a boiling point of at least 130° C. at 0.1 MPa.

Component (B) is a compound which can undergo thermal polymerization and/or photopolymerization, because component (B) has at least one ethylenic unsaturated group.

Here, examples of the ethylenic unsaturated group include (meth)acryloyl groups and vinyl groups.

Examples of a compound having one ethylenic unsaturated group in the molecule thereof, having a molecular weight below 1,000 and having a boiling point of at least 130° C. at 0.1 MPa include an alcohol (meth)acrylate that is an addition product between phenol and ethylene oxide, an alcohol (meth)acrylate that is an addition product between p-cumylphenol and ethylene oxide, an alcohol (meth)acrylate that is an addition product between nonylphenol and ethylene oxide, 2-hydroxy-3-(o-phenylphenoxy) propyl acrylate, o-phenylphenolglycidylether (meth)acrylate, an alcohol (meth)acrylate that is an addition product between tribromophenol and ethylene oxide, tribromophenyl (meth)acrylate, pentabromophenyl acrylate, pentabromobenzyl acrylate, 2,2,3,3-tetrafluoropropyl (meth)acrylate, 2,2,3,3,3-pentafluoropropyl (meth)acrylate, 2,2,3,3,4,4,4-heptafluorobutyl (meth)acrylate, 2,2,3,4,4,4-hexafluorobutyl (meth)acrylate, 1H,1H,5H-octafluoropentyl (meth)acrylate, 2-(perfluorohexyl)ethyl (meth)acrylate, 2-(perfluorooctyl) ethyl (meth)acrylate, 2-(perfluorodecyl)ethyl (meth)acrylate, 2-(perfluorododecyl)ethyl (meth)acrylate;

Examples of commercially available ones of the above include Viscoat 3F, 4F and 8F (all made by Osaka Organic Chemical Industry Co., Ltd), NK ester #410P, A-BPEF, A-CMP-1E (all made by Shin-Nakamura Chemical Co., Ltd), CHEMINOX FAAC-ML (made by Unimatec Co., Ltd).

Examples of a compound having two ethylenic unsaturated groups in the molecule thereof, having a molecular weight below 1,000 and having a boiling point of at least 130° C. at 0.1 MPa include ethylene glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate di(meth)acrylate, 9,9-bis[4-(2-acryloyloxyethoxy)phenyl]fluorene, brominated epoxy acrylate, bis(hydroxymethyl)tricyclodecane di(meth)acrylate, a diol di(meth)acrylate that is an addition product of bisphenol A and ethylene oxide or propylene oxide, a diol di(meth)acrylate that is an addition product between hydrogenated bisphenol A and ethylene oxide or propylene oxide, epoxy (meth)acrylates obtained by adding a (meth)acrylate to a diglycidyl ether of bisphenol A, and diacrylates of polyoxyalkylene-modified bisphenol A.

Examples of a compound having three ethylenic unsaturated groups in the molecule thereof, having a molecular weight below 1,000 and having a boiling point of at least 130° C. at 0.1 MPa include a compound in which 3 mols or more of (meth) acrylic acid are bonded via ester linkages to a polyhydric alcohol having three or more hydroxyl groups. Examples thereof include trimethylolpropane tri(meth)acrylate, pentaerythritol tri(meth)acrylate, trimethylolpropane trioxyethyl (meth)acrylate, tris(2-hydroxyethyl)isocyanurate tri(meth)acrylate, and dipentaerythritol hexa(meth)acrylate.

Moreover, a polyether acrylic oligomer, a polyester acrylic oligomer, and a polyurethane acrylic oligomer, each of which has a polyether, a polyester or polyurethane backbone in the main chain respectively, or a polyepoxy acrylic oligomer can also be used.

Examples of commercially available ones of the above include Yupimer UV SA1002 and SA2007 (both made by Mitsubishi Chemical Corporation), Viscoat #195, #230, #215, #260, #295, #300, #335HP, #360, #400, #540, #700, 3PA and GPT (all made by Osaka Organic Chemical Industry Co., Ltd.), Light Acrylate 4EG-A, 9EG-A, NP-A, DCP-A, BP-4EA, BP-4PA, PE-3A, PE-4A and DPE-6A (all made by Kyoeisha Chemical Co., Ltd.), KAYARAD MANDA, HX-220, HX-620, R-551, R-712, R-604, R-684, PET-30, GPO-303, TMPTA, DPHA, D-310, D-330, DPCA-20, DPCA-30, DPCA-60 and DPCA-120 (all made by Nippon Kayaku Co., Ltd.), AronixM208, M210, M215, M220, M240, M305, M309, M310, M315, M325, M400, M1200, M6100, M6200, M6250, M7100, M8030, M8060, M8100, M8530, M8560 and M9050 (all made by Toagosei Co., Ltd.), Ripoxy VR-77, VR-60 and VR-90 (all made by Showa Highpolymer Co., Ltd.), Ebecryl 81, 83, 600, 629, 645, 745, 754, 767, 701, 755, 705, 770, 800, 805, 810, 830, 450, 1830 and 1870 (all made by Daicel-UCB Co., Ltd.), and Beamset 575, 551B, 502H and 102 (all made by Arakawa Chemical Industries, Ltd.).

The photosensitive resin composition of the present invention is treated by heat in an oven or hotplate for removing the solvent after being applied. If a compound having a boiling point below 130° C. at 0.1 MPa is used instead of component (B), the compound will evaporate by the heat treatment after being applied. This evaporation is unfavorable.

The content of component (B) is preferably 5 to 100 parts by mass, more preferably 10 to 70 parts by mass, most preferably 15 to 40 parts by mass, relative to 100 parts by mass of component (A). If this content is less than 5 parts by mass, then when forming an optical waveguide, the precision of the desired waveguide shape may be poor, whereas if this content exceeds 100 parts by mass, then the compatibility with component (A) may deteriorate, and hence roughening of the surface of the cured material may arise.

[Component (C)]

Component (C) is a photoradical polymerization initiator which is able to produce active species (i.e. radicals), which is capable of polymerizing component (A) and component (B) together, upon exposure to light.

Here, 'light' means, for example, infrared rays, visible rays, ultraviolet rays, or ionizing radiation such as X-rays, electron rays, α-rays, β-rays or γ-rays.

Examples of such photoradical polymerization initiators include acetophenone, acetophenone benzyl ketal, 1-hydroxycyclohexyl phenyl ketone, 2,2-dimethoxy-2-phenylacetophenone, xanthone, fluorenone, benzaldehyde, fluorene, anthraquinone, triphenylamine, carbazole, 3-methylacetophenone, 4-chlorobenzophenone, 4,4'-dimethoxybenzophenone, 4,4'-diaminobenzophenone, Michler's ketone, benzoinpropyl ether, benzoin ethyl ether, benzyl dimethyl ketal, 1-(4-isopropylphenyl)-2-hydroxy-2-methylpropan-1-one, 2-hydroxy-2-methyl-1-phenylpropan-1-one, thioxanthone, diethylthioxanthone, 2-isopropylthioxanthone, 2-chlorothioxanthone, 2-methyl-1-[4-(methylthio)phenyl]-2-morpholino-propan-1-one, 2,4,6-trimethylbenzoyldiphenylphosphine oxide, bis(2,6-dimethoxybenzoyl)-2,4,4-trimethylpentylphosphine oxide, and the like.

Examples of commercially available photoradical polymerization initiators include Irgacure 184, 369, 379, 651, 500, 819, 907, 784, 2959, CGI1700, CGI1750, CGI1850 and CG24-61, and Darocur 1116 and 1173 (all made by Ciba Specialty Chemicals), Lucirin TPO and TPO-L (both made by BASF), and Ebecryl P36 (made by UCB).

Such photoradical polymerization initiator may be used alone, or two or more may be used in combination.

The content of component (C) in the photosensitive resin composition of the present invention is preferably 0.1 to 10 mass %, more preferably 0.2 to 5 mass %. If this content is less than 0.1 mass %, then curing will not proceed sufficiently, and hence problems will arise in terms of the transmission characteristics of the optical waveguide. On the other hand, if this content exceeds 10 mass %, then the photoradical polymerization initiator may adversely affect the long-term transmission characteristics.

In the present invention, a photosensitizer may be used together with such a photoradical polymerization initiator. If such a photosensitizer is also used, then energy rays such as light can be absorbed more effectively.

Examples of such photosensitizers include xanthone, thioxanthone, diethylthioxanthone, and other thioxanthone derivatives; anthraquinone, bromoanthraquinone, and other anthraquinone derivatives; anthracene, bromoanthracene, and other anthracene derivatives; perylene and perylene derivatives; coumarin and ketocoumarin, and the like. The type of the photosensitizer may be selected in accordance with the type of the photoradical polymerization initiator.

The photosensitive resin composition of the present invention preferably further contains an organic solvent as component (D). By including an organic solvent, the storage stability of the photosensitive resin composition can be improved, and moreover the photosensitive resin composition can be given a suitable viscosity, and hence an optical waveguide having a uniform thickness can be formed.

The type of the organic solvent can be selected as appropriate on condition that the objects and effects of the present invention are not impaired; an organic solvent that has a boiling point at atmospheric pressure in a range of 50 to 200°

C., and in which the constituent components of the photosensitive resin composition will uniformly dissolve, is preferable. Specifically, the organic solvent used for preparing component (A) can be used as component (D).

Preferable examples of such an organic solvent include alcohols, ethers, esters, and ketones. A most preferable organic solvent is at least one compound selected from the group consisting of propylene glycol monomethyl ether acetate, propylene glycol monomethyl ether, ethyl lactate, diethylene glycol dimethyl ether, methyl isobutyl ketone, methyl amyl ketone, toluene, xylene, and methanol.

The content of the organic solvent is preferably 10 to 500 parts by mass, more preferably 20 to 300 parts by mass, most preferably 30 to 150 parts by mass, relative to 100 parts by mass in total of components (A) to (C). If this content is less than 10 parts by mass, then adjusting the viscosity of the photosensitive resin composition may become difficult. If this content exceeds 500 parts by mass, then it may be difficult to form an optical waveguide or the like having a sufficient thickness.

In addition to components (A) to (D) described above, the resin composition of the present invention may further contain, for example, compounds having one polymerizable reactive group in the molecule thereof other than components (A) and (B), macromolecular resins (e.g. an epoxy resin, an acrylic resin, a polyamide resin, a polyamide-imide resin, a polyurethane resin, a polybutadiene resin, a polychloroprene resin, a polyether resin, a polyester resin, a styrene-butadiene block copolymer, a petroleum resin, a xylene resin, a ketone resin, a cellulose resin, a fluoropolymer, or a silicone polymer), and so on as required, on condition that the characteristics of the resin composition of the present invention are not impaired.

Furthermore, various other additives can be included as required, such as antioxidants, ultraviolet absorbers, light stabilizers, silane coupling agents, coated surface improvers, thermal polymerization inhibitors, leveling agents, surfactants, colorants, preservatives/stabilizers, plasticizers, lubricants, fillers, inorganic particles, ageing resistors, wettability improvers, and antistatic agents.

Examples of antioxidants include Irganox 1010, 1035, 1076 and 1222 (all made by Ciba Specialty Chemicals), and Antigene P, 3C and FR, and Sumilizer (all made by Sumitomo Chemical Industries). Examples of ultraviolet absorbers include Tinuvin P, 234, 320, 326, 327, 328, 329 and 213 (all made by Ciba Specialty Chemicals), and Seesorb 102, 103, 110, 501, 202, 712 and 704 (all made by Shipro Kasei). Examples of light stabilizers include Tinuvin 292, 144 and 622LD (all made by Ciba Specialty Chemicals), Sanol LS770 (made by Sankyo), and Sumisorb TM-061 (made by Sumitomo Chemical Industries). Examples of silane coupling agents include γ-aminopropyltriethoxysilane, γ-mercaptopropyltrimethoxysilane, and γ-methacryloxypropyltrimethoxysilane, with commercially available ones including SH6062 and 6030 (both made by Dow Corning Toray Silicone), and KBE903, 603 and 403 (all made by Shin-Etsu Chemical). Examples of coated surface improvers include silicone additives such as dimethylsiloxane polyethers, with commercially available ones including DC-57 and DC-190 (both made by Dow Corning), SH-28PA, SH-29PA, SH-30PA and SH-190 (all made by Dow Corning Toray Silicone), KF351, KF352, KF353 and KF354 (all made by Shin-Etsu Chemical), and L-700, L-7002, L-7500 and FK-024-90 (all made by Nippon Unicar).

To prepare the photosensitive resin composition of the present invention, the respective components described above may be mixed and stirred together using an ordinary method.

Following is a description of an example of an optical waveguide formed using photosensitive resin compositions of the present invention, with reference to the drawings. FIG. 1 is a sectional view showing schematically an example of an optical waveguide of the present invention, and FIG. 2 is a flowchart showing an example of an optical waveguide manufacturing method of the present invention.

[1. Structure of Optical Waveguide]

In FIG. 1, the optical waveguide 24 is constituted from a substrate 10, a lower clad layer 12 formed on an upper surface of the substrate 10, a core portion 20 having a specific width formed on an upper surface of the lower clad layer 12, and an upper clad layer 22 formed by laminating on the core portion 20 and the lower clad layer 12. The core portion 20 is embedded in the lower clad layer 12 and the upper clad layer 22, which form the external shape of the optical waveguide 24.

There are no particular limitations on the thicknesses of the lower clad layer, the core portion and the upper clad layer, but for example, it is preferable to set the thickness of the lower clad layer to be within a range of 1 to 200 μm, the thickness of the core portion to be with in a range of 3 to 200 μm, and the thickness of the upper clad layer to be within a range of 1 to 200 μm. There are no particular limitations on the width of the core portion, but this width is, for example, within a range of 1 to 200 μm.

The refractive index of the core portion must be greater than the refractive index of each of the lower clad layer and the upper clad layer. For example, for light having a wavelength of 400 to 1,600 nm, it is preferable for the refractive index of the core portion to be with in a range of 1.420 to 1.650, for the refractive index of each of the lower clad layer and the upper clad layer to be within a range of 1.400 to 1.648, and for the refractive index of the core portion to be at least 0.1% greater than the refractive index of each of the two clad layers.

[2. Optical Waveguide Manufacturing Method]

A method of manufacturing the optical waveguide 24 of the present invention comprises a step of forming the lower clad layer 12, a step of forming the core portion 20, and a step of forming the upper clad layer 22. At least one of these three steps is a step in which a cured material is formed by irradiating a photosensitive resin composition as described above with light.

For convenience, the photosensitive resin compositions for forming the lower clad layer 12, the core portion 20 and the upper clad layer 22 constituting the optical waveguide will be referred to as the 'lower layer composition', the 'core composition' and the 'upper layer composition' respectively.

(1) Preparation of Photosensitive Resin Compositions

The compositions of the lower layer composition, the core composition and the upper layer composition are set such that the relationship between the refractive indices of the lower clad layer 12, the core portion 20 and the upper clad layer 22 satisfies the conditions required of the optical waveguide. Specifically, two or three photosensitive resin compositions are prepared so that the difference in the refractive index is appropriate magnitude. Of these photosensitive resin compositions, the photosensitive resin composition giving a cured film having the highest refractive index is used as the core composition, and the other photosensitive resin compositions are used as the lower layer composition and the upper layer composition.

In terms of economics and manufacturing management, it is preferable for the lower layer composition and the upper layer composition to be the same photosensitive resin composition.

The viscosity of the photosensitive resin compositions is preferably in a range of 1 to 10,000 cps (25° C.), more preferably 5 to 8,000 cps (25° C.), most preferably 10 to 5,000 cps (25° C.). If the viscosity is outside such a range, then handling of the photosensitive resin composition may become difficult, or it may become difficult to form a uniform coating film. The viscosity can be adjusted as appropriate by changing the content of an organic solvent or the like.

(2) Preparation of Substrate

As shown in FIG. 2(a), a substrate 10 having a flat surface is prepared. There are no particular limitations on the type of the substrate 10, but for example, a silicon substrate, a glass substrate or the like can be used.

(3) Lower Clad Layer Formation Step

This is a step of forming the lower clad layer 12 on the surface of the substrate 10. Specifically, as shown in FIG. 2(b), the lower layer composition is applied onto the surface of the substrate 10, and dried or pre-baked to form a lower layer thin film. The lower layer thin film is then cured by being irradiated with light, and then the lower clad layer 12 is formed as the cured product. In the step of forming the lower clad layer 12, it is preferable to irradiate the whole of the thin film with light, thus curing the whole of the thin film.

As the method of applying the lower layer composition, any method such as a spin coating method, a dipping method, a spraying method, a bar coating method, a roll coating method, a curtain coating method, a gravure printing method, a silk screen method, or an ink jet method can be used. Of these, it is preferable to use the spin coating method, since a lower layer thin film having a uniform thickness can be obtained.

Moreover, to make the rheological properties of the lower layer composition suitable for the application method, it is preferable to include any of various leveling agents, thixotropy agents, fillers, organic solvents, surfactants and so on in the lower layer composition as required.

Moreover, after the application, the lower layer thin film comprising the lower layer composition is preferably pre-baked at a temperature of 50 to 200° C. so as to remove the organic solvent and so on.

The method for the application, the method for improving the rheological properties and so on in the lower clad layer formation step also can be applied to the core portion formation step and the upper clad layer formation step described below.

There are no particular limitations on the irradiation dose of the light when forming the lower clad layer, but it is preferable to carry out the exposure by irradiating with light having a wavelength of 200 to 450 nm and intensity of 1 to 500 mW/cm$^2$ such that the irradiation dose is 10 to 5000 mJ/cm$^2$.

As the type of the irradiated rays, visible rays, ultraviolet rays, infrared rays, X-rays, α-rays, β-rays, γ-rays or the like can be used, but ultraviolet rays are most preferable. As the irradiation apparatus, it is preferable to use, for example, a high-pressure mercury lamp, a low-pressure mercury lamp, a metal halide lamp or an excimer lamp.

Moreover, after the exposure, it is preferable to carry out heating treatment (i.e. post-baking). The heating conditions vary according to the composition of the photosensitive resin composition and so on, but it is generally preferable to make the heating time be, for example, 5 minutes to 72 hours, at 30 to 400° C., preferably 50 to 300° C., more preferably 100 to 200° C. By carrying out such heating treatment (i.e. post-baking), the whole of the coating film can be sufficiently cured.

The irradiation dose, type of the light, the irradiation apparatus for the light (e.g. ultraviolet radiation), and so on in the lower clad layer formation step also can be applied to the core portion formation step and the upper clad layer formation step described below.

(4) Core Portion Formation Step

Next, as shown in FIG. 2(c), the core composition is applied onto the lower clad layer 12, and dried or pre-baked to form a core thin film 14.

After that, as shown in FIG. 2(d), light 16 is irradiated (i.e. exposure is carried out) onto the upper surface of the core thin film 14 following a prescribed pattern, for example, via a photomask 18 having a prescribed line pattern. As a result, only parts of the core thin film 14 irradiated with the light are cured, and hence by carrying out developing so as to remove the remaining uncured parts, a core portion 20 comprising a patterned cured film can be formed on the lower clad layer 12 as shown in FIG. 2(e).

The details of the developing in this step are as follows.

In the developing, for the thin film that has been selectively cured by exposing with light following the prescribed pattern, only the uncured parts are removed using a developing solution, this being by utilizing the difference in solubility between the cured parts and the uncured parts. That is, after the patterned exposure, the uncured parts are removed while leaving behind the cured parts, thus forming the core portion.

An organic solvent can be used as the developing solution used in the developing. Examples of the organic solvent include acetone, methanol, ethanol, isopropyl alcohol, ethyl lactate, propylene glycol monomethyl ether acetate, methyl amyl ketone, methyl ethyl ketone, cyclohexanone, propylene glycol monomethyl ether, and the like.

The developing time is generally 30 to 600 seconds. As the developing method, a publicly known method such as a liquid mounting method, a dipping method, or a showering developing method can be used. After the developing, blow drying is carried out to remove the organic solvent, whereby a patterned thin film is formed.

After the patterned thin film (i.e. patterned part) has been formed, this patterned part is subjected to heating treatment (i.e. post-baking). The heating conditions vary according to the types of components and so on of the photosensitive resin composition, but the heating time is generally made to be, for example, 5 minutes to 10 hours, at a heating temperature of 30 to 400° C., preferably 50 to 300° C., more preferably 100 to 200° C. By carrying out such heating treatment (i.e. post-baking), the whole of the coating film can be sufficiently cured.

In the present step, the method of irradiating with light following the prescribed pattern is not limited to a method using a photomask 18 comprising parts through which the light can pass and parts through which the light cannot pass, but rather, for example, any of the following methods a to c may also be used.

a. A method using means for electrooptically forming a mask image comprising regions through which the light can pass and regions through which the light cannot pass following a prescribed pattern, using a similar principle to a liquid crystal display apparatus.

b. A method in which a light-guiding member comprising a bundle of many optical fibers is used, and irradiation with light is carried out via the optical fibers in accordance with a prescribed pattern in the light-guiding member.

c. A method in which laser light, or convergent light obtained using a converging optical system such as a lens or a mirror, is irradiated onto the photosensitive resin composition while being scanned.

(5) Upper Clad Layer Formation Step

The upper layer composition is applied onto the surface of the core portion 20 and the lower clad layer 12, and is dried or pre-baked to form an upper layer thin film. The upper layer thin film is then cured by being irradiated with light, whereby an upper clad layer 22 is formed as shown in FIG. 2(f).

Next, the upper clad layer 22 is subjected to heating treatment (i.e. post-baking).

The heating conditions vary according to the types of components and so on of the photosensitive resin composition, but it is generally preferable to make the heating time be, for example, 5 minutes to 72 hours, at 30 to 400° C., preferably 50 to 300° C., more preferably 100 to 200° C. By carrying out such heating treatment (i.e. post-baking), the whole of the coating film can be sufficiently cured.

EXAMPLES

Following is a more detailed description of the present invention through working examples.

[1. Preparation of Materials]

The following materials were prepared as components (A) to (D).

(1) Component (A)

Preparation Example 1

A flask equipped with a dry ice/methanol reflux condenser was purged with nitrogen, and then 3 g of 2,2'-azobisisobutyronitrile as a polymerization initiator, and 115 g of propylene glycol monomethyl ether acetate as an organic solvent were put into the flask, and were stirred until the polymerization initiator dissolved. Next, 20 g of hydroxyethyl methacrylate, 30 g of dicyclopentanyl acrylate, 25 g of styrene, and 25 g of n-butyl acrylate were put into the flask, and then gentle stirring was commenced. After that, the temperature of the solution was raised to 80° C., and polymerization was carried out for 6 hours at this temperature. After that, 0.13 g of di-n-butyl tin dilaurate, and 0.05 g of 2,6-di-t-butyl-p-cresol were added to the solution obtained, and then while stirring, 23.7 g of 2-methacryloxyethyl isocyanate was instilled in such that the temperature was maintained at not more than 60° C. After the instillation had been completed, reaction was carried out for 5 hours at 60° C., thus obtaining a solution of a polymer having methacryl groups on side chains thereof. After that, the reaction product was instilled into a large amount of hexane, thus coagulating the reaction product. The coagulum was then redissolved in tetrahydrofuran. The mass of the tetrahydrofuran used was the same as the mass of the coagulum. After that, the reaction product was once again coagulated using a large amount of hexane. This redissolving and coagulating operation was carried out three times in total, and then the coagulum obtained was vacuum-dried for 48 hours at 40° C., thus obtaining the desired copolymer A-1.

Preparation Example 2

A flask equipped with a dry ice/methanol reflux condenser was purged with nitrogen, and then 3 g of 2,2'-azobisisobutyronitrile as a polymerization initiator, and 115 g of propylene glycol monomethyl ether acetate as an organic solvent were put into the flask, and were stirred until the polymerization initiator dissolved. Next, 35 g of hydroxyethyl methacrylate, 30 g of dicyclopentanyl acrylate, 25 g of styrene, and 10 g of n-butyl acrylate were put into the flask, and then gentle stirring was commenced. After that, the temperature of the solution was raised to 80° C., and polymerization was carried out for 6 hours at this temperature. After that, 0.13 g of di-n-butyl tin dilaurate, and 0.05 g of 2,6-di-t-butyl-p-cresol were added to the solution obtained, and then while stirring, 41.5 g of 2-methacryloxyethyl isocyanate was instilled in such that the temperature was maintained at not more than 60° C. After the instillation had been completed, reaction was carried out for 5 hours at 60° C., thus obtaining a solution of a polymer having methacryl groups on side chains thereof. After that, the reaction product was instilled into a large amount of hexane, thus coagulating the reaction product. The coagulum was then redissolved in tetrahydrofuran. The mass of the tetrahydrofuran used was the same as the mass of the coagulum. After that, the reaction product was once again coagulated using a large amount of hexane. This redissolving and coagulating operation was carried out three times in total, and then the coagulum obtained was vacuum-dried for 48 hours at 40° C., thus obtaining the desired copolymer A-2.

Preparation Example 3

A flask equipped with a dry ice/methanol reflux condenser was purged with nitrogen, and then 3 g of 2,2'-azobisisobutyronitrile as a polymerization initiator, and 150 g of ethyl lactate as an organic solvent were put into the flask, and were stirred until the polymerization initiator dissolved. Next, 20 g of methacrylic acid, 30 g of dicyclopentanyl acrylate, 25 g of styrene, and 25 g of n-butyl acrylate were put into the flask, and then gentle stirring was commenced. After that, the temperature of the solution was raised to 80° C., and polymerization was carried out for 6 hours at this temperature. After that, 10.5 g of 3,4-epoxycyclohexylmethyl acrylate, 0.8 g of tetrabutylammonium bromide, and 0.1 g of p-methoxyphenol were added to the solution obtained, and then the mixture was stirred for 7 hours at 80° C., thus obtaining a solution of a polymer having acryl groups on side chains thereof. After that, the reaction product was instilled into a large amount of hexane, thus coagulating the reaction product. The coagulum was then redissolved in tetrahydrofuran. The mass of the tetrahydrofuran used was the same as the mass of the coagulum. After that, the reaction product was once again coagulated using a large amount of hexane. This redissolving and coagulating operation was carried out three times in total, and then the coagulum obtained was vacuum-dried for 48 hours at 40° C., thus obtaining the desired copolymer A-3.

Preparation Example 4

A flask equipped with a dry ice/methanol reflux condenser was purged with nitrogen, and then 1.5 g of 2,2'-azobis(2,4-dimethylvaleronitrile) as a polymerization initiator, and 115 g of propylene glycol monomethyl ether acetate as an organic solvent were put into the flask, and were stirred until the polymerization initiator dissolved. Next, 20 g of hydroxyethyl methacrylate, 25 g of dicyclopentanyl acrylate, 40 g of methyl methacrylate, and 15 g of n-butyl acrylate were put into the flask, and then gentle stirring was commenced. After that, the temperature of the solution was raised to 70° C., and polymerization was carried out for 6 hours at this temperature. After that, 0.12 g of di-n-butyl tin dilaurate, and 0.05 g of 2,6-di-t-butyl-p-cresol were added to the solution obtained, and then while stirring, 23.7 g of 2-methacryloxyethyl isocyanate was instilled in such that the temperature was maintained at not more than 60° C. After the instillation had been completed, reaction was carried out for 5 hours at 60° C., thus obtaining a solution of a polymer having methacryl groups on side chains thereof. After that, the reaction product was instilled into a large amount of hexane, thus coagulating the reaction product. The coagulum was then redissolved in tetrahydrofuran. The mass of the tetrahydrofuran used was the same as the mass of the coagulum. After that, the reaction product was once again coagulated using a large amount of hexane. This redissolving and coagulating operation was carried out a total of three times, and then the coagulum obtained was vacuum-dried for 48 hours at 40° C., thus obtaining the desired copolymer A-4.

Preparation Example 5

A flask equipped with a dry ice/methanol reflux condenser was purged with nitrogen, and then 1.5 g of 2,2'-azobis(2,4-dimethylvaleronitrile) as a polymerization initiator, and 115 g of propylene glycol monomethyl ether acetate as an organic solvent were put into the flask, and were stirred until the polymerization initiator dissolved. Next, 30 g of hydroxyethyl methacrylate, 25 g of dicyclopentanyl acrylate, 40 g of methyl methacrylate, and 5 g of n-butyl acrylate were put into the flask, and then gentle stirring was commenced. After that, the temperature of the solution was raised to 70° C., and polymerization was carried out for 6 hours at this temperature. After that, 0.13 g of di-n-butyl tin dilaurate, and 0.05 g of 2,6-di-t-butyl-p-cresol were added to the solution obtained, and then while stirring, 35.6 g of 2-methacryloxyethyl isocyanate was instilled in such that the temperature was maintained at not more than 60° C. After the instillation had been completed, reaction was carried out for 5 hours at 60° C., thus obtaining a solution of a polymer having methacryl groups on side chains thereof. After that, the reaction product was instilled into a large amount of hexane, thus coagulating the reaction product. The coagulum was then redissolved in tetrahydrofuran. The mass of the tetrahydrofuran used was the same as the mass of the coagulum. After that, the reaction product was once again coagulated using a large amount of hexane. This redissolving and coagulating operation was carried out three times in total, and then the coagulum obtained was vacuum-dried for 48 hours at 40° C., thus obtaining the desired copolymer A-5.

Preparation Example 6

A flask equipped with a dry ice/methanol reflux condenser was purged with nitrogen, and then 1 g of 2,2'-azobis(2,4-dimethylvaleronitrile) as a polymerization initiator, and 150 g of ethyl lactate as an organic solvent were put into the flask, and were stirred until the polymerization initiator dissolved. Next, 20 g of methacrylic acid, 25 g of dicyclopentanyl acrylate, 35 g of methyl methacrylate, and 20 g of n-butylacrylate were put in to the flask, and then gentle stirring was commenced. After that, the temperature of the solution was raised to 70° C., and polymerization was carried out for 6 hours at this temperature. After that, 31.4 g of 3,4-epoxycyclohexylmethyl acrylate, 2.2 g of tetrabutylammonium bromide, and 0.1 g of p-methoxyphenol were added to the solution obtained, and then the mixture was stirred for 7 hours at 80° C., thus obtaining a solution of a polymer having acryl groups on side chains thereof. After that, the reaction product was instilled into a large amount of hexane, thus coagulating the reaction product. The coagulum was then redissolved in tetrahydrofuran. The mass of the tetrahydrofuran used was the same as the mass of the coagulum. After that, the reaction product was once again coagulated using a large amount of hexane. This redissolving and coagulating operation was carried out a total of three times, and then the coagulum obtained was vacuum-dried for 48 hours at 40° C., thus obtaining the desired copolymer A-6.

(2) Component (B)

Trimethylolpropane triacrylate (boiling point: 315° C.; TMP3A, made by Osaka Organic Chemical Industry Co., Ltd.)

Polyfunctional acrylate (Aronix M8100, made by Toagosei Co., Ltd.)

Tribromophenolethoxy acrylate (New frontier BR-31, made by Dai-ichi Kogyo Seiyaku co., Ltd.)

o-phenylphenolglycidylether acrylate (NK ester #401P, made by Shin-Nakamura Chemical Co., Ltd)

2,2,3,3-tetrafluoropropyl acrylate (boiling point: 132° C., Viscoat 4F, made by Osaka Organic Chemical Industry Co., Ltd.)

(3) Component (C)

Photoradical polymerization initiator (trade name 'Irgacure 369', made by Ciba Specialty Chemicals)

(4) Component (D)

Ethyl Lactate

Propylene Glycol Monomethyl Ether Acetate

[2. Preparation of Photosensitive Resin Compositions]

Photosensitive resin compositions J-1 to J-11 were obtained by uniformly mixing together a component (A) (one of copolymers A-1 to A-6) as described above and components (B) to (D) in the proportions shown in Table 1.

TABLE 1

| unit: parts by mass | | J-1 | J-2 | J-3 | J-4 | J-9 | J-10 | J-5 | J-6 | J-7 | J-8 | J-11 |
|---|---|---|---|---|---|---|---|---|---|---|---|---|
| | | for core portion | | | | | | for clad layer | | | | |
| component A | A-1 | 100 | — | — | — | 100 | 100 | — | — | — | — | — |
| | A-2 | — | 100 | — | — | — | — | — | — | — | — | — |
| | A-3 | — | — | 100 | 100 | — | — | — | — | — | — | — |
| | A-4 | — | — | — | — | — | — | 100 | — | — | — | 100 |
| | A-5 | — | — | — | — | — | — | — | 100 | — | — | — |
| | A-6 | — | — | — | — | — | — | — | — | 100 | 100 | — |
| component B | Trimethylolpropane triacrylate | 20 | 30 | 50 | 20 | — | — | 30 | 12 | 30 | 45 | — |
| | Aronix M8100 | — | — | — | — | — | — | — | 18 | 45 | — | — |

TABLE 1-continued

| unit: parts by mass | | J-1 | J-2 | J-3 | J-4 | J-9 | J-10 | J-5 | J-6 | J-7 | J-8 | J-11 |
|---|---|---|---|---|---|---|---|---|---|---|---|---|
| | | for core portion | | | | | | for clad layer | | | | |
| | New frontier BR-31 | — | — | — | — | 20 | — | — | — | — | — | — |
| | NK ester #401P | — | — | — | — | — | 20 | — | — | — | — | — |
| | Viscoat 4F | — | — | — | — | — | — | — | — | — | — | 30 |
| component C | Irgacure 369 | 3 | 3 | 3 | 3 | 3 | 3 | 3 | 3 | 3 | 3 | 3 |
| component D | Ethyl lactate | — | — | 140 | 145 | — | — | — | — | 140 | 135 | — |
| | Propylene glycol monomethyl ether acetate | 90 | 85 | — | — | 90 | 90 | 95 | 100 | — | — | 95 |
| total | | 213 | 218 | 293 | 298 | 213 | 213 | 228 | 233 | 318 | 283 | 228 |

[3. Formation of Optical Waveguides]

(1) Example 1

(a) Formation of Lower Clad Layer

Photosensitive resin composition J-5 was applied onto the surface of a silicon substrate using a spin coater, and pre-baking was carried out under conditions of 10 minutes at 100° C. using a hot plate. Next, the coating film comprising the photosensitive resin composition J-5 was irradiated with ultraviolet rays having a wavelength of 365 nm and intensity of 10 mW/cm² for 100 seconds, thus photocuring the coating film. The cured film was then post-baked under conditions of 1 hour at 150° C., thus forming a lower clad layer having a thickness of 50 µm.

(b) Formation of Core Portion

Next, photosensitive resin composition J-1 was applied onto the lower clad layer using a spin coater so as to form a coating film, and pre-baking was carried out under conditions of 10 minutes at 100° C. After that, the coating film having a thickness of 50 µm which comprises the photosensitive resin composition J-1 was irradiated with ultraviolet rays having a wavelength of 365 nm and intensity of 10 mW/cm² for 100 seconds via a photomask which has a line pattern having a width of 50 µm, thus curing the coating film. Next, the substrate having the cured coating film thereon was immersed in a developing solution comprising acetone, thus dissolving the unexposed parts of the coating film. After that, post-baking was carried out under conditions of 1 hour at 150° C., thus forming a core portion which has a line pattern having a width of 50 µm.

(c) Formation of Upper Clad Layer

Next, photosensitive resin composition J-5 was applied onto the upper surfaces of the lower clad layer and the core portion using a spin coater, and pre-baking was carried out under conditions of 10 minutes at 100° C. using a hot plate. After that, the coating film comprising the photosensitive resin composition J-5 was irradiated with ultraviolet rays having a wavelength of 365 nm and intensity of 10 mW/cm² for 100 seconds, thus forming an upper clad layer having a thickness of 50 µm.

(2) Examples 2 to 5

Optical waveguides were formed in the same way as Example 1, except the photosensitive resin compositions were changed as shown in Table 2.

(3) Comparative Example 1

(a) Formation of Lower Clad Layer

Photosensitive resin composition J-7 was applied onto the surface of a silicon substrate using a spin coater, and pre-baking was carried out under conditions of 10 minutes at 100° C. using a hot plate. Next, the coating film comprising the photosensitive resin composition J-7 was irradiated with ultraviolet rays having a wavelength of 365 nm and intensity of 10 mW/cm² for 100 seconds, thus photocuring the coating film. The cured film was then post-baked under conditions of 1 hour at 150° C., thus forming a lower clad layer having a thickness of 50 µm.

(b) Formation of Core Portion

Next, photosensitive resin composition J-3 was applied onto the lower clad layer using a spin coater so as to form a coating film, and pre-baking was carried out under conditions of 10 minutes at 100° C. After that, the coating film having a thickness of 50 µm which comprises the photosensitive resin composition J-3 was irradiated with ultraviolet rays having a wavelength of 365 nm and intensity of 10 mW/cm² for 100 seconds via a photomask which has a line pattern having a width of 50 µm, thus curing the coating film. Next, the substrate having the cured coating film thereon was immersed in a developing solution comprising a 1.0% tetramethylammonium hydroxide (TMAH) aqueous solution, thus dissolving the unexposed parts of the coating film. After that, post-baking was carried out under conditions of 1 hour at 150° C., thus forming a core portion which has a line pattern having a width of 50 µm.

(c) Formation of Upper Clad Layer

Next, photosensitive resin composition J-7 was applied onto the upper surfaces of the lower clad layer and the core portion using a spin coater, and pre-baking was carried out under conditions of 10 minutes at 100° C. using a hot plate. After that, the coating film comprising the photosensitive resin composition J-7 was irradiated with ultraviolet rays having a wavelength of 365 nm and intensity of 10 mW/cm² for 100 seconds, thus forming an upper clad layer having a thickness of 50 µm.

(4) Comparative Examples 2 and 3

Optical waveguides were formed in the same way as Comparative Example 1, except the photosensitive resin compositions were changed as shown in Table 2.

[4. Evaluation of Optical Waveguides]

Each of the optical waveguides (Examples 1 to 5, and Comparative Examples 1 to 3) was evaluated as follows.

(1) Shape Precision of Optical Waveguide

Comparing with the designed core shape (height 50 μm×line width 50 μm), the case that both the height and the line width of the core portion actually formed were within a range of 50±5 μm was taken as 'O', and the case that this was not so was taken as 'x'.

(2) Waveguide Loss (Initial Loss)

Light having a wavelength of 850 nm was inputted into the optical waveguide from one end thereof. The quantity of light emerging from the other end was then measured, and the waveguide loss per unit length was determined using a cut-back method. The case that the waveguide loss was 0.5 dB/cm or less taken as 'O', and the case that the waveguide loss exceeded 0.5 dB/cm was taken as 'x'.

(3) Waveguide Loss (High-temperature and High-humidity)

The optical waveguide was stored for 500 hours under conditions of a temperature of 85° C. and a humidity of 85%, and then the optical waveguide loss was measured in the same way as in '(2) Waveguide loss (initial loss)' above. The case that the waveguide loss was not more than 1 dB/cm was taken as 'O', and the case that the waveguide loss exceeded 1 dB/cm was taken as 'x'.

The results of the above are shown in Table 2.

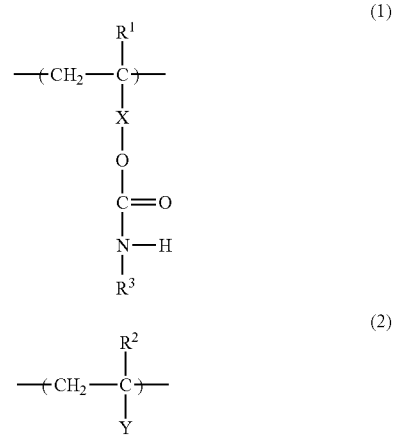

(in the formulae, each of $R^1$ and $R^2$ is independently a hydrogen atom or an alkyl group having 1 to 12 carbon atoms, $R^3$ is an organic group containing a radical-po-

TABLE 2

|  | Example 1 | Example 2 | Example 3 | Example 4 | Example 5 | Comparative Example 1 | Comparative Example 2 | Comparative Example 3 |
|---|---|---|---|---|---|---|---|---|
| [Structure of waveguide] | | | | | | | | |
| Lower clad layer | J-5 | J-6 | J-6 | J-11 | J-5 | J-7 | J-8 | J-7 |
| Core portion | J-1 | J-2 | J-1 | J-9 | J-10 | J-3 | J-4 | J-4 |
| Upper clad layer | J-5 | J-6 | J-6 | J-11 | J-5 | J-7 | J-8 | J-7 |
| [Charactaristics of waveguide] | | | | | | | | |
| Shape precision of core portion | O | O | O | O | O | O | O | O |
| Waveguide loss (intial loss) | O | O | O | O | O | O | O | O |
| Waveguide loss (high-temperature and high-humidity) | O | O | O | O | O | X | X | X |

From Table 2, it can be seen that for the optical waveguides formed using photosensitive resin compositions of the present invention (Examples 1 to 5), the shape precision of the core portion is high, and the waveguide loss is low for both the initial loss and the loss under high temperature and high humidity. On the other hand, it can be seen that for the optical waveguides comprising photosensitive resin compositions outside the present invention (Comparative Examples 1 to 3), the waveguide loss under high temperature and high humidity is high, and hence the transmission characteristics under severe conditions will be poor.

What is claimed is:

1. An optical waveguide comprising a lower clad layer, a core portion, and an upper clad layer, wherein at least one of the lower clad layer, the core portion, and the upper clad layer comprises a cured material of a photosensitive resin composition comprising:

(A) a polymer comprising structures represented by the following general formulae (1) and (2)

lymerizable reactive group, X is a single bond or a bivalent organic group, and Y is a non-polymerizable organic group);

(B) a compound comprising at least one ethylenic unsaturated group, having a molecular weight below 1,000 and having a boiling point of at least 130° C. at 0.1 MPa; and (C) a photoradical polymerization initiator.

2. The optical waveguide according to claim 1, wherein the component (A) is a copolymer which does not contain carboxyl groups and which is obtained by reacting:

(a) at least one radical-polymerizable compound having a hydroxyl group;

(b) at least one radical-polymerizable compound other than components (a) and (c); and (c) an isocyanate having a radical-polymerizable reactive group.

3. The optical waveguide according to claim 1, wherein component (A) is a polymer comprising structures represented by the following general formulae (3) and (4)

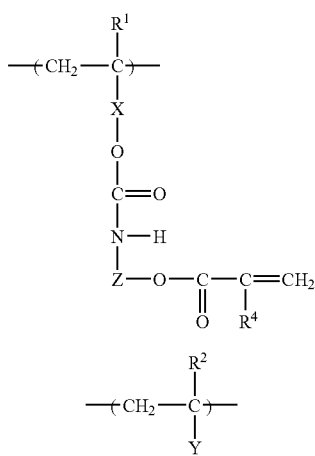

(in the formulae, each of $R^1$ and $R^2$ is independently a hydrogen atom or an alkyl group having 1 to 12 carbon atoms, $R^4$ is a hydrogen atom or a methyl group, each of X and Z independently is a single bond or a bivalent organic group, and Y is a non-polymerizable organic group).

4. The optical waveguide according to claim 1, wherein the photosensitive resin composition is an organic solvent developable type composition.

5. A method of manufacturing an optical waveguide comprising a lower clad layer, a core portion, and an upper clad layer, the method comprising:
   forming the lower clad layer;
   forming the core portion; and
   forming the upper clad layer;
   wherein:
   at least one of forming the lower clad layer, forming the core portion, and forming the upper clad layer comprises photocuring a photosensitive resin composition by irradiating the composition with light; and the photosensitive resin composition comprises:
(A) a polymer comprising structures represented by the following general formulae (1) and (2)

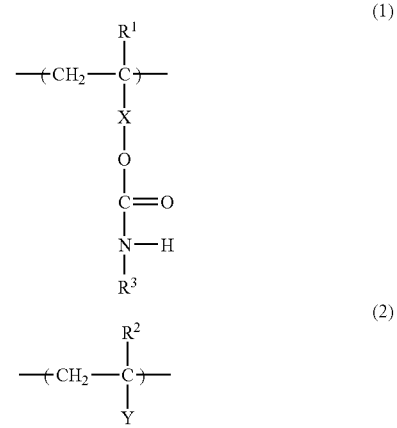

(in the formulae, each of $R^1$ and $R^2$ is independently a hydrogen atom or an alkyl group having 1 to 12 carbon atoms, $R^3$ is an organic group containing a radical-polymerizable reactive group, X is a single bond or a bivalent organic group, and Y is a non-polymerizable organic group);

(B) a compound comprising at least one ethylenic unsaturated group, having a molecular weight below 1,000 and having a boiling point of at least 130° C. at 0.1 MPa; and (C) a photoradical polymerization initiator.

6. The method of claim 5, comprising developing the photosensitive resin composition with a developing solution comprising an organic solvent after photocuring the photosensitive resin composition.

* * * * *